United States Patent
Nguyen et al.

(10) Patent No.: US 6,847,241 B1
(45) Date of Patent: Jan. 25, 2005

(54) DELAY LOCK LOOP USING SHIFT REGISTER WITH TOKEN BIT TO SELECT ADJACENT CLOCK SIGNALS

(75) Inventors: Andy T. Nguyen, San Jose, CA (US); Shi-dong Zhou, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/627,457

(22) Filed: Jul. 25, 2003

(51) Int. Cl.[7] .............................................. H03L 7/06
(52) U.S. Cl. ...................... 327/158; 327/161; 327/163; 377/69
(58) Field of Search ................................. 327/147, 149, 327/152, 153, 156, 158, 407, 161–163, 261, 264, 270, 271, 276, 277, 284, 298; 377/69, 77–80

(56) References Cited

U.S. PATENT DOCUMENTS

| | | | | |
|---|---|---|---|---|
| 5,544,203 A | * | 8/1996 | Casasanta et al. | 375/376 |
| 5,604,775 A | * | 2/1997 | Saitoh et al. | 375/376 |
| 5,870,445 A | * | 2/1999 | Farwell | 375/371 |
| 6,333,959 B1 | * | 12/2001 | Lai et al. | 377/69 |
| 6,628,154 B2 | * | 9/2003 | Fiscus | 327/158 |
| 6,639,442 B1 | * | 10/2003 | Ghameshlu et al. | 327/293 |

* cited by examiner

*Primary Examiner*—Timothy P. Callahan
*Assistant Examiner*—Hai L. Nguyen
(74) *Attorney, Agent, or Firm*—Lois D. Cartier

(57) ABSTRACT

Delay lock loop (DLL) circuits, systems, and methods providing glitch-free output clock signals. Glitches are eliminated from an output clock signal by using shift registers including a single token bit to select one of many delayed clock signals. A DLL clock multiplexer includes a series of shift registers, each of which selects only one of the many input clock signals at each stage. Thus, only one clock signal is selected at any given time. Delay is added or subtracted from the loop by shifting the token bit within each shift register. The token bit is shifted by a single position at a time. Therefore, no glitching occurs.

18 Claims, 10 Drawing Sheets

DELAY LOCK LOOP USING SHIFT REGISTER WITH TOKEN BIT TO SELECT ADJACENT CLOCK SIGNALS

FIELD OF THE INVENTION

The invention relates to delay lock loops (DLLs). More particularly, the invention relates to a DLL that uses a shift register-based multiplexer select mechanism to prevent glitches on the DLL output clock signal.

BACKGROUND OF THE INVENTION

Clock signals are used in virtually every integrated circuit (IC) and electronic system to control timing. For example, every time a rising edge occurs on a clock signal, all the flip-flops in a circuit might change state. Clearly, clocks are often heavily loaded signals, and can be bussed throughout a very large IC. Even with specially-designed global buffers, there is typically a delay between the clock edge received by the IC at the pad, and the clock edge received by the last-served flip-flop on the IC (i.e., between the "input clock signal" and the "destination clock signal").

This delay, designated herein as td can cause difficulties in interfacing between Ics, or can simply slow down the overall system speed. Input data can be provided in synchronization with the input clock signal, while output data is typically provided in synchronization with the destination clock signal. Further, td often varies not only between different ICs, but on a single IC with temperature and voltage as well. It is highly desirable to have a circuit and method for synchronizing a destination clock signal with an input clock signal, so that the destination clock signals of various ICs can be commonly synchronized by synchronizing each destination clock signal to a common input clock signal.

This clock synchronization procedure is often performed using a phase-lock loop (PLL) or delay-lock loop (DLL). However, known PLLs and DLLs consume a great deal of silicon area. Additionally, PLLs are often analog in nature and take a very long time to simulate, and a design that works in one manufacturing process might stop working when manufactured using another process. Further, analog PLLs can be particularly sensitive to radiation. Hence, PLLS are very difficult to design, and often are not feasible in a given circuit or system.

Therefore, DLLs are often a preferred method of performing clock synchronization. However, the output signals provided by known DLLs can be "glitchy" or "noisy", i.e., can pulse briefly high or low, during periods when the DLL is changing state. DLLs typically run continuously during the entire time the two clock signals must be synchronized, frequently adjusting the DLL output clock signal to keep the destination clock signal properly synchronized with the input clock signal. Hence, a glitchy output signal from a DLL can inject significant noise into the clock network served by the DLL.

Therefore, it is desirable to provide a DLL that provides a glitch-free output clock signal.

SUMMARY OF THE INVENTION

The invention provides delay lock loop (DLL) circuits, systems, and methods providing glitch-free output clock signals. Glitches are eliminated from an output clock signal by using shift registers including a single token bit to select one of many delayed clock signals. A DLL clock multiplexer includes a series of shift registers, each of which selects only one of the many input clock signals at each stage. Thus, only one clock signal is selected at any given time. Delay is added or subtracted from the loop by shifting the token bit within each shift register. The token bit is shifted by a single position at a time. Therefore, no glitching occurs.

According to one embodiment of the invention, a DLL coupled between output and input terminals of a clock network includes: an input clock terminal; a feedback clock terminal coupled to the output terminal of the clock network; a delay line having an input terminal coupled to the input clock terminal and having a plurality of output terminals providing a plurality of intermediate clock signals; a control circuit having a first input terminal coupled to the feedback clock terminal, a second input terminal coupled to the input clock terminal, and a plurality of control output terminals; and a bi-directional shift register and clock multiplexer. The bi-directional shift register and clock multiplexer has a plurality of data input terminals coupled to the output terminals of the delay line, a plurality of control input terminals coupled to the control output terminals of the control circuit, and an output terminal coupled to the input terminal of the clock network. The bi-directional shift register includes a token bit shifted under control of the control circuit, and the clock multiplexer selects one of the intermediate clock signals, as determined by a location of the token bit within the bi-directional shift register, to supply to the output terminal.

According to another aspect of the invention, a method of synchronizing a feedback clock signal from a clock network with an input clock signal includes: receiving the feedback clock signal; receiving the input clock signal; providing from the input clock signal a plurality of intermediate clock signals delayed from the input clock signal by incremental unit delays; shifting a first token bit in either of two directions within a first shift register; selecting from among the intermediate clock signals a selected clock signal based on a location of the first token bit within the first shift register; and providing the selected clock signal to the clock network.

According to yet another aspect of the invention, a multiplexer circuit includes N data input terminals, an output terminal, first and second bi-directional shift registers, and an N-to-M multiplexer. N and M are integers, where M is less than N. The first bi-directional shift register has N bits and N output terminals, and exactly one of the N bits has a first token value. The N-to-M multiplexer includes N data input terminals coupled to the N data input terminals of the multiplexer circuit, N control terminals coupled to the N output terminals of the first bi-directional shift register, and M output terminals. The second bi-directional shift register has M bits and M output terminals, and exactly one of the M bits has a second token value. The M-to-1 multiplexer includes M data input terminals coupled to the M data output terminals of the N-to-M multiplexer, M control terminals coupled to the M output terminals of the second bi-directional shift register, and an output terminal coupled to the output terminal of the multiplexer circuit.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
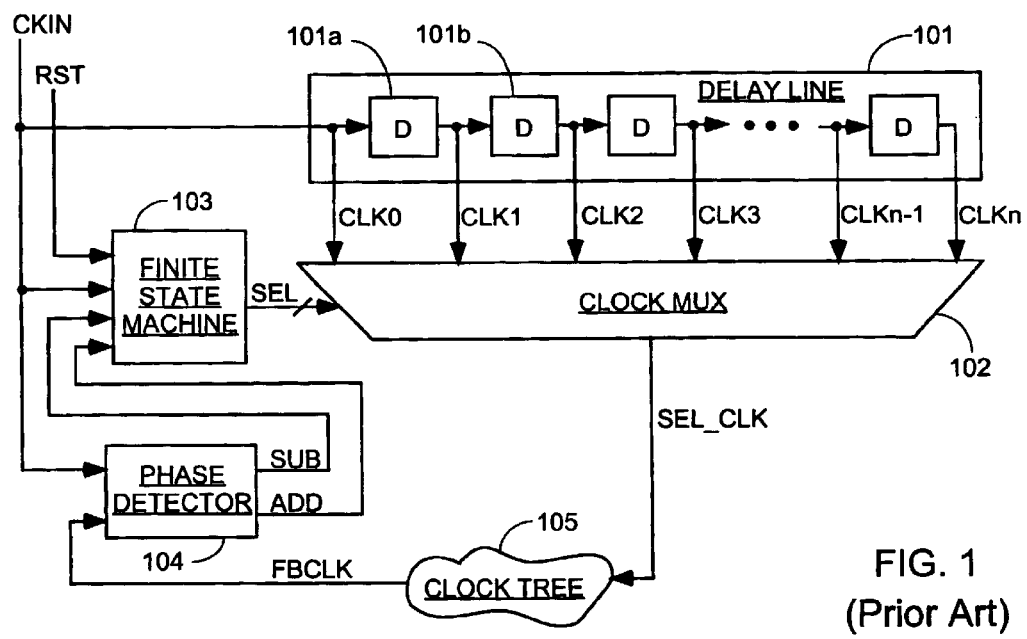
FIG. 1 is a block diagram of a system including a known delay lock loop (DLL).

FIG. 1 is a block diagram of a system including a known delay lock loop (DLL). The DLL of FIG. 1 accepts an input clock signal CKIN and inserts a delay into a feedback path between the input clock signal CKIN and a feedback clock signal FBCLK. (In the present specification, the same reference characters are used to refer to terminals, signal lines, and their corresponding signals.) The delay, by design, is the closest available delay to that required to bring the feedback clock signal FBCLK into synchronization with the input clock signal CKIN.

The DLL of FIG. 1 includes a delay line 101, a clock multiplexer 102, a finite state machine 103, and a phase detector 104. The system also includes a clock tree (clock network) 105. The input clock signal CKIN is provided to delay line 101, which includes a series of delay elements 101a, 101b, and so forth. Each delay element has the same unit delay D. Delay line 101 provides a series of intermediate clock signals CLK0–CLKn to clock multiplexer 102. Under the control of finite state machine 103, clock multiplexer 102 selects the appropriately delayed one of intermediate clock signals CLK0–CLKn and provides the selected clock signal SEL_CLK to clock tree 105.

Clock tree 105 provides the feedback clock signal FBCLK to phase detector 104. Phase detector 104 compares the rising edge of feedback clock signal FBCLK with the rising edge of input clock signal CKIN, and determines whether additional delay needs to be added to the input clock (e.g., ADD goes high) or subtracted from the input clock (e.g., SUB goes high) to synchronize the two clocks signals. Phase detector 104 provides signals ADD and SUB to finite state machine 103, where the two signals are used to generate the appropriate select signals SEL for clock multiplexer 102. A reset signal RST places finite state machine 103 in a reset (e.g., initial) state.

Figure 2:
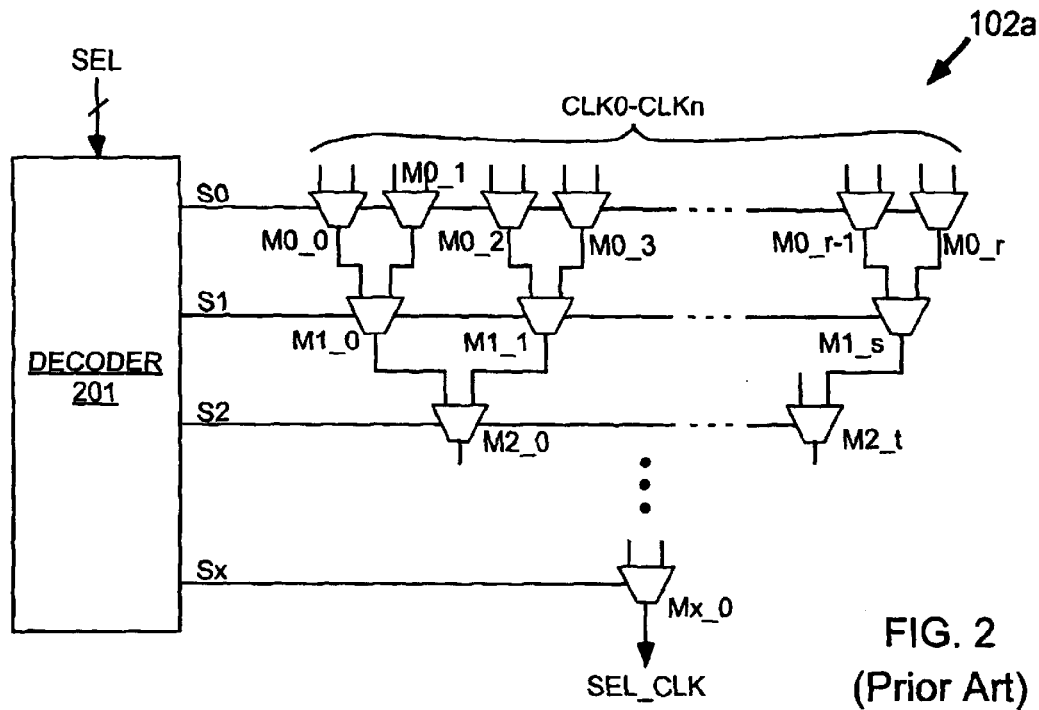
FIG. 2 is a block diagram of a first known clock multiplexer that can by used, for example, in the DLL of FIG. 1.

FIG. 2 shows a known clock multiplexer 102a that can be used to implement clock multiplexer 102 of FIG. 1. Clock multiplexer 102a includes a "tree" of 2-to-1 multiplexers Mx__y. A first set of multiplexers M0__0 through M0__r are driven by the intermediate clock signals CLK0–CLKn from delay line 101 (see FIG. 1). Under the control of select signal S0, the number of clock signals is reduced by a factor of two. A second set of multiplexers M1__0 through M0__s are driven by the selected signals from the first set of multiplexers M0__0 through M0__r. Under the control of select signal S1, the number of clock signals is again reduced by a factor of two. A third set of multiplexers M2__0 through M2__t reduces the number of clock signals by another factor of two under the control of select signal S2. This progression continues until a single clock signal SEL_CLK is selected by multiplexer Mx__0 under the control of select signal Sx. The select signals S0–Sx are provided by a decoder 201, which decodes the select signals SEL from finite state machine 103 (see FIG. 1).

Figure 3:
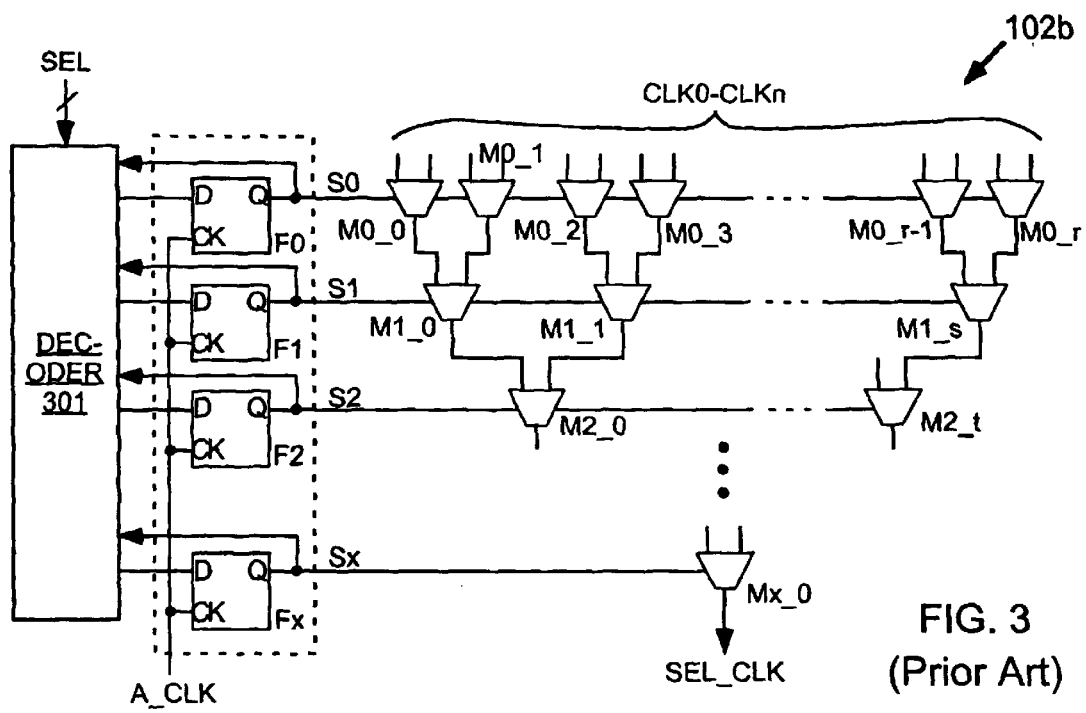
FIG. 3 is a block diagram of a second known clock multiplexer that can be used, for example, in the DLL of FIG. 1.

Clearly, glitches on the select signals S0–Sx can cause the temporary selection of the wrong clock signal. To minimize glitching on the select signals S0–Sx, designers sometimes register the select signals, as shown in FIG. 3. In clock multiplexer 102b of FIG. 3, each select signal S0–Sx has a corresponding flip-flop F0–Fx in which the select signal is stored while the decoder 301 is settling to a new value. Only when signal A_CLK goes high do the select signals change to a new state.

However, even the circuit shown in FIG. 3 does not eliminate the temporary selection of an incorrect clock signal. Firstly, not all of flip-flops F0–Fx necessarily change state at exactly the same time, due to delays on clock signal A_CLK between the different flip-flops. Secondly, delays on the select lines themselves can cause multiplexers in the same row to switch at different times. For example, an RC delay along the length of select line S0 can cause a difference in the time at which signal S0 reaches multiplexers M0__0 and M0__r.

Figure 4:
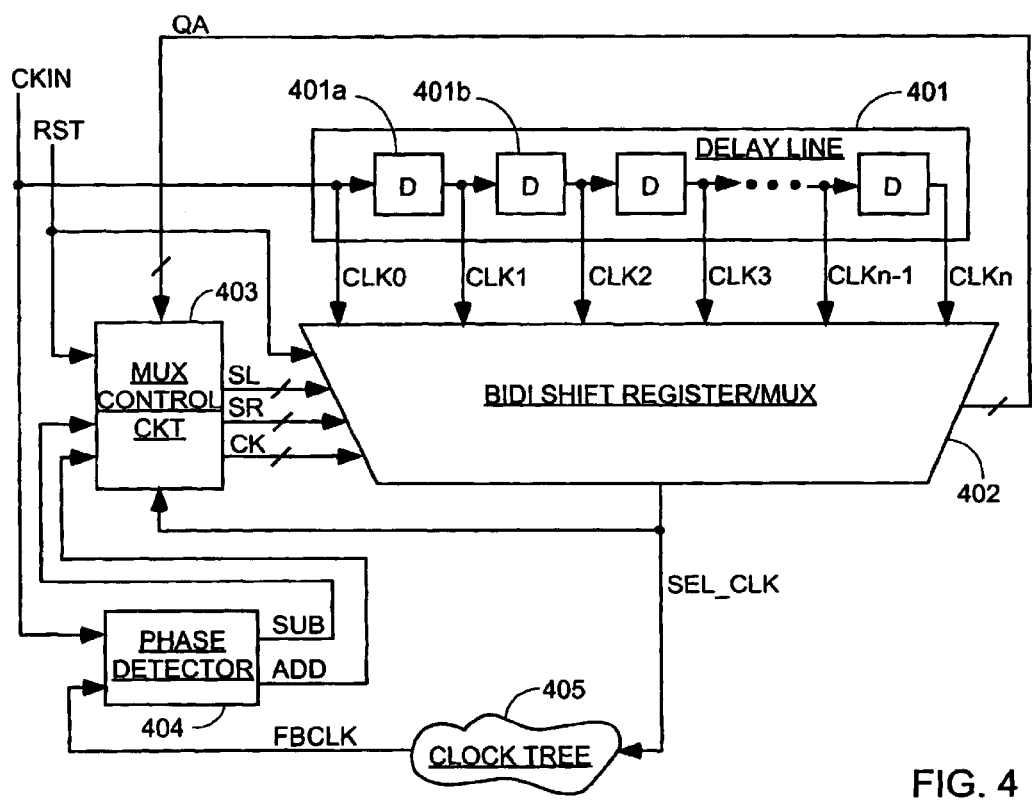
FIG. 4 is a block diagram of a system including a DLL according to an embodiment of the present invention.

To address these issues, a system according to the present invention includes a DLL in which only one of the intermediate clock signals can be selected at any one time, with no glitching present on the output of the clock multiplexer. FIG. 4 illustrates one such system, according to one embodiment of the present invention.

The DLL of FIG. 4 includes a delay line 401, a bi-directional shift register and multiplexer 402, a multiplexer control circuit 403, and a phase detector 404. The system also includes a clock tree (clock network) 405. Delay line 401 can, for example, be similar to delay line 101 of FIG. 1. Phase detector 404 can be similar, for example, to phase detector 104 of FIG. 1. Clock tree 405 can be similar, for example, to clock tree 105 of FIG. 1. Bi-directional shift register and multiplexer 402 is controlled by shift left enable signals SL, shift right enable signals SR, and clock signals CK, all provided by multiplexer control circuit 403.

Comparing the DLL of FIG. 4 to the DLL of FIG. 1, it can be seen that clock multiplexer 102 of FIG. 1 has been replaced by bi-directional shift register and multiplexer 402. Bi-directional shift register and multiplexer 402 performs a similar function to clock multiplexer 102 in that it selects one of the intermediate clock signals CLK0–CLKn, and provides the selected clock signal SEL_CLK to a clock tree.

However, bi-directional shift register and multiplexer 402 performs this function in a different fashion than is typically used, providing several advantages to the system.

Figure 5:
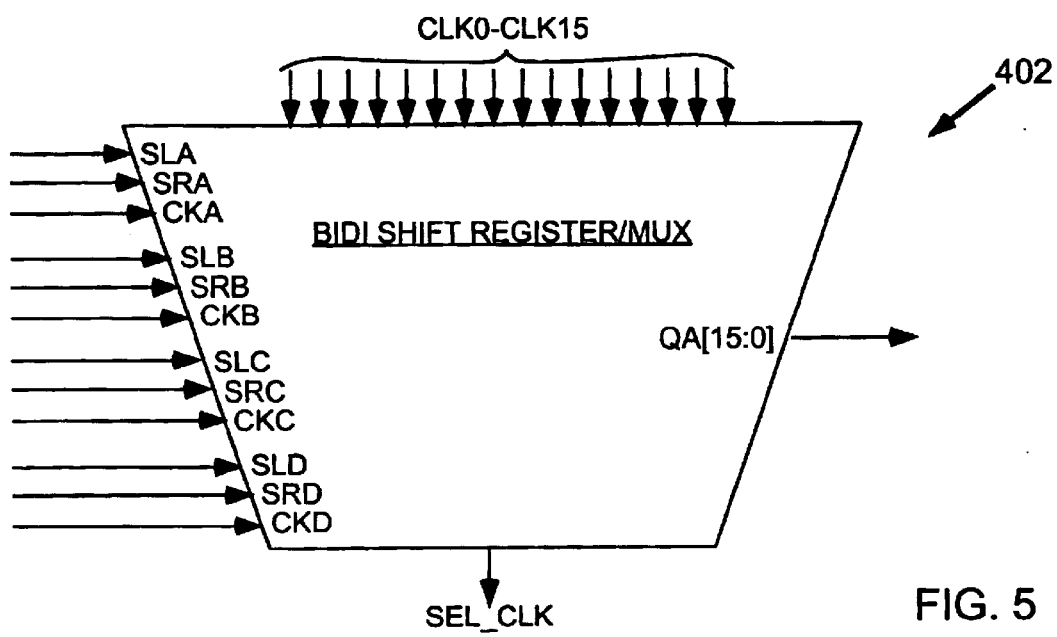
FIG. 5 is a block diagram showing the input and output signals of a bi-directional shift register and multiplexer that can be used, for example, in the DLL of FIG. 4.

FIG. 5 is a block diagram illustrating the input and output signals of bi-directional shift register and multiplexer 402, according to one embodiment. The exemplary shift register/MUX shown in FIGS. 5–9 goes through a four-stage selection process, the stages being designated herein as A–D. (Note that other embodiments include different numbers of stages.) In the pictured embodiment, the four stages each divide the number of available intermediate clock signals by two. Therefore, in the pictured embodiment, 16 intermediate clock signals CLK0–CLK15 are provided to shift register/MUX 402. Note that in most DLLS, many more than 16 intermediate clock signals are provided. However, an exemplary embodiment including 16 intermediate clock signals is shown and described herein to clarify the invention. A DLL having a larger number of intermediate clock signals is easily extrapolated from the pictured embodiment by those of skill in the relevant arts.

In the pictured embodiment, each of the four stages is controlled by a different set of control signals. The first stage is controlled by shift left enable signal SLA, shift right enable signal SRA, and clock signal CKA. The second stage is controlled by shift left enable signal SLB, shift right enable signal SRB, and clock signal CKB. The third stage is controlled by shift left enable signal SLC, shift right enable signal SRC, and clock signal CKC. The fourth stage is controlled by shift left enable signal SLD, shift right enable signal SRD, and clock signal CKD.

Figure 6:
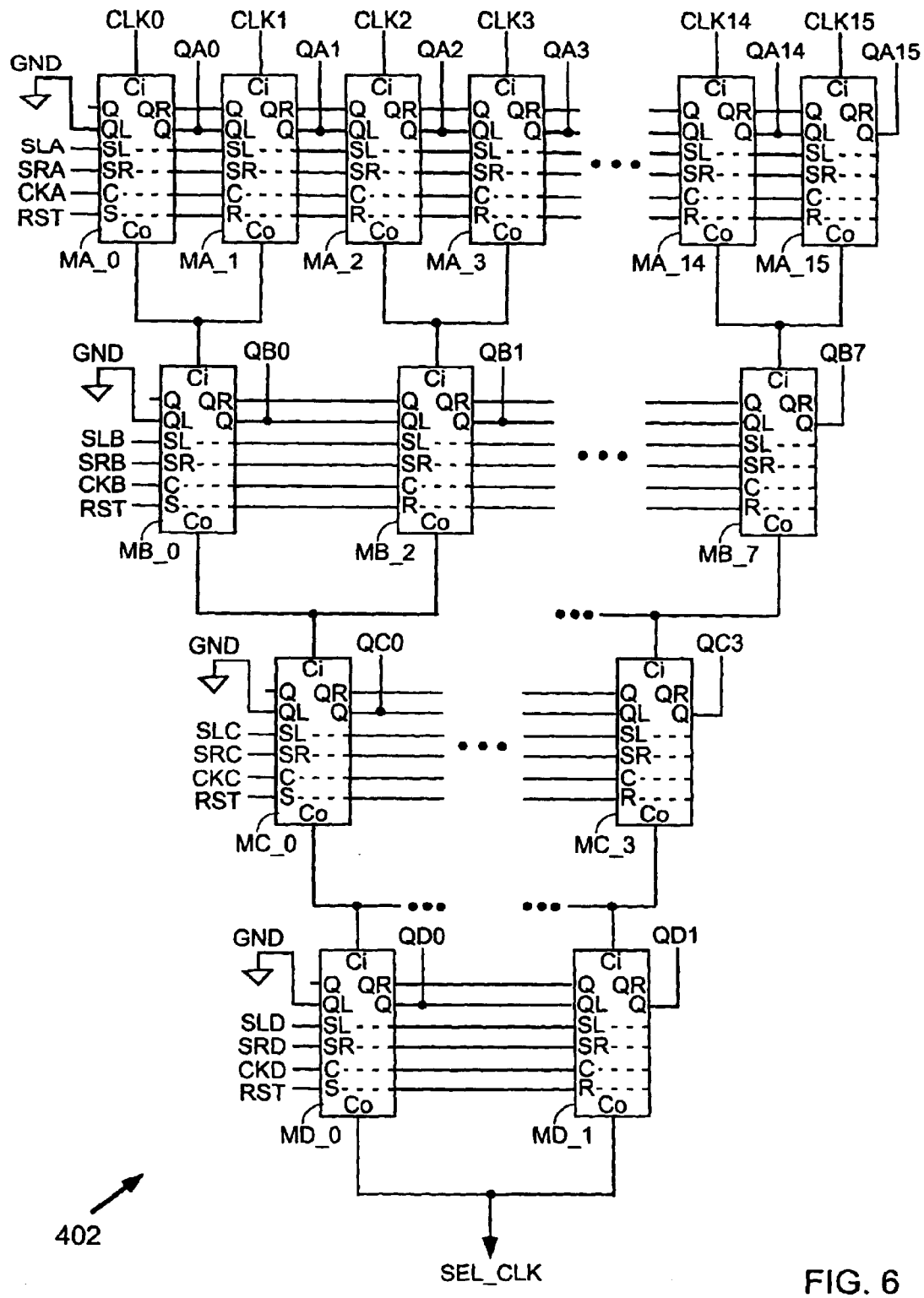
FIG. 6 is a schematic diagram of one embodiment of the bi-directional shift register and multiplexer of FIG. 5.

FIG. 6 illustrates one embodiment of bi-directional shift-register and multiplexer 402 of FIGS. 4 and 5. A top row of circuits MA_0 through MA_15 performs the first stage of the selection process, which functions as follows. Each of circuits MA_0 through MA_15 includes one bit of a 16-bit shift register. Only one bit of the shift register includes a predetermined "token" value, which in the pictured embodiment is a high value. When a shift right command is received (e.g., shift right enable signal SRA is high and clock signal CKA goes high), the token bit shifts by one location to the right. When a shift left command is received (e.g., shift left enable signal SLA is high and clock signal CKA goes high), the token bit shifts by one location to the left. If neither of signals SRA and SLA are high when clock signal CKA goes high, no shift occurs.

Note that the location of the token bit in the shift register controls the selection of the intermediate clock signal. Further, because only one bit in the shift register includes the token value at any given time, only one intermediate clock signal can be selected. Hence, no glitching occurs on the output signals resulting from each stage of the selection process.

A second row of circuits MB_0 through MB_7 performs the second stage of the selection process. As in the first stage, each of circuits MB_0 through MB_7 includes one bit of a shift register, in this case an 8-bit shift register. Only one bit of the shift register includes a second token value. The second token value can be the same as the first token value, or the two token values can be different. In the pictured embodiment, all token values are high (i.e., the token bit for each shift register is high, while all other values in each shift register are low). The second-stage shift register is controlled by shift right enable signal SRB, shift left enable signal SLB, and clock signal CKA.

Similarly, a third row of circuits MC_0 through MC_3 performs the third stage of the selection process. Each of circuits MC_0 through MC_3 includes one bit of a 4-bit shift register. Only one bit of the shift register includes a third token value. The third-stage shift register is controlled by shift right enable signal SRC, shift left enable signal SLC, and clock signal CKC.

The final selection of an intermediate clock signal to provide selected signal SEL_CLK is performed in the last shift register, a 2-bit shift register including circuits MD_0 and MD_1. One of circuits MD_0 and MD_1 includes a fourth token value. The fourth-stage shift register is controlled by shift right enable signal SRD, shift left enable signal SLD, and clock signal CKD.

Note that at each stage of the selection process, the single bit with the token value selects exactly one of the intermediate clock signals. When a change is made as to which of the clock signals is selected, the token bit shifts by one location within the shift register, e.g., one location to the right to select the clock signal with an additional unit delay, or one location to the left to select the clock signal with one less unit delay. Therefore, at most two bits change state at a time, one from low to high, and an adjacent bit from high to low. Because the bits are adjacent, there is no appreciable delay between the clock signal controlling the state change. Thus, no glitch occurs.

The various stages of the selection process can occur simultaneously or at different times. Sometimes only one or a few of the stages might be changing at a given time. Thus, only one or a few of the shift registers are shifting. At other times or in other embodiments, all of the stages can shift.

Figure 7:
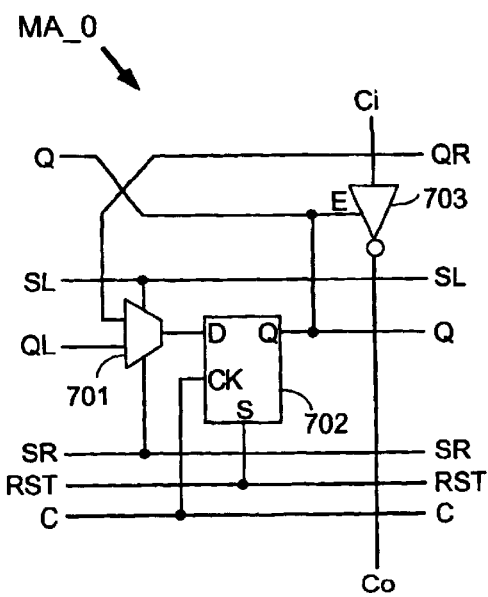
FIG. 7 is a schematic diagram of a set bit circuit of the bi-directional shift register and multiplexer of FIG. 6, according to one embodiment.
Figure 8:
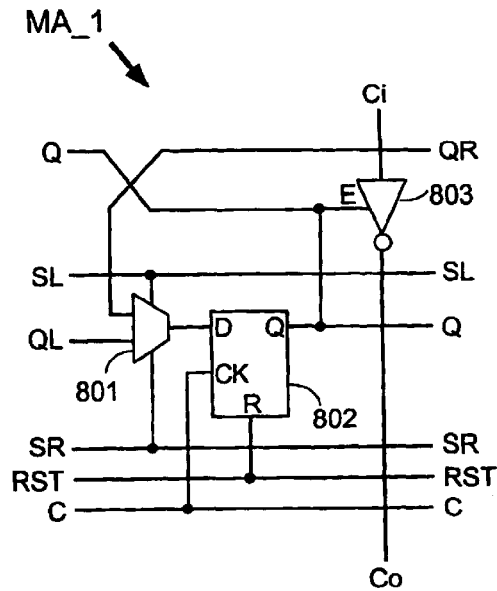
FIG. 8 is a schematic diagram of a reset bit circuit of the bi-directional shift register and multiplexer of FIG. 6, according to one embodiment.
Figure 9:
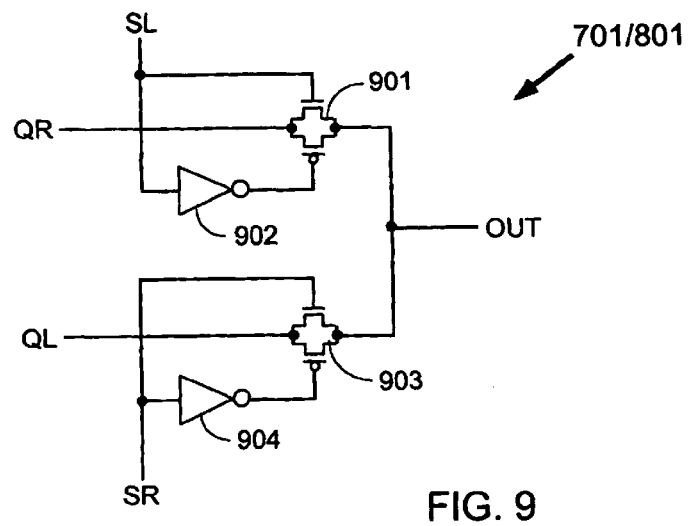
FIG. 9 is a schematic diagram of a 2-to-1 multiplexer that can be used in the set and reset bit circuits of FIGS. 7 and 8.

FIGS. 7–9 provide details of the embodiment of FIG. 6. FIGS. 7–8 provide set and reset versions, respectively, of the circuits used to implement bi-directional shift register and multiplexer 402 of FIG. 6. FIG. 9 provides one embodiment of a multiplexer used to implement the circuits of FIGS. 7–8. However, any known 2-to-1 multiplexer implementation suitable to the application can be used.

Referring again to FIG. 6, if only one bit in each shift register has the token value, a way must be provided to set one bit to the token value and the other bits to the opposite value. In the embodiment of FIG. 6, this capability is provided by using a single "set" bit circuit in each shift register, and using a "reset" bit circuit for each of the other bits. In other words, the reset signal RST places a high value (the token value) in exactly one of the bits (e.g., the leftmost bit in FIG. 6) of each shift register.

The set bit circuit of FIG. 7 includes a 2-to-1 multiplexer 701, a D-type set flip-flop 702, and a tristate buffer 703. The shift register bit includes multiplexer 701 and flip-flop 702, with multiplexer 701 selecting an adjacent bit from the right side QR or the left side QL to shift into flip-flop 702 via the data input terminal D. Shift left enable signal SL (SLA-SLD) enables a left shift, which occurs when clock signal CK (CKA-CKD) goes high. Shift right enable signal SR (SRA-SRD) enables a right shift, which occurs when clock signal CK (CKA-CKD) goes high. Signal RST sets the value in flip-flop 702 to a high value.

Tristate buffer 703 contributes to the multiplexer function of shift register/MUX 402 (see FIGS. 4 and 5). When the bit stored in flip-flop 702 is high, tristate buffer 703 is enabled, and the associated intermediate clock signal on input terminal Ci is passed to the output terminal Co. When the bit stored in flip-flop 702 is low, tristate buffer 703 is disabled, and the associated intermediate clock signal on terminal Ci is not passed to output terminal Co.

The set bit circuit of FIG. 7 can be used, for example, to implement circuits MA_0, MB_0, MC_0, and MD_0 of FIG. 6.

FIG. 8 illustrates a reset bit circuit similar to the set bit circuit of FIG. 7. The reset bit circuit of FIG. 8 includes a 2-to-1 multiplexer 801, a D-type reset flip-flop 802, and a tristate buffer 803. Other than the use of a reset flip-flop 802, the circuit functions in a similar manner to the set bit circuit shown in FIG. 7. The reset bit circuit of FIG. 8 can be used, for example, to implement the bit circuits of FIG. 6 that are not implemented using the set bit circuit of FIG. 7.

FIG. 9 shows one embodiment of multiplexers 701 and 801 of FIGS. 7 and 8. The 2-to-1 multiplexer of FIG. 9 includes two CMOS passgates 901 and 903 and two inverters 902 and 904. Passgate 901 is coupled between terminals QR and OUT, and is controlled by signal SL. Passgate 902 is coupled between terminals QL and OUT, and is controlled by signal SR. Signal QL is the signal stored in the shift register bit to the left of the present bit. Signal QR is the signal stored in the shift register bit to the right of the present bit. When signal SL (shift left enable) is high, signal QL is passed to the output terminal OUT, and hence to the data input terminal D of the associated flip-flop. When signal SR (shift right enable) is high, signal QR is passed to the output terminal OUT, and hence to the data input terminal D of the associated flip-flop.

Figure 10:
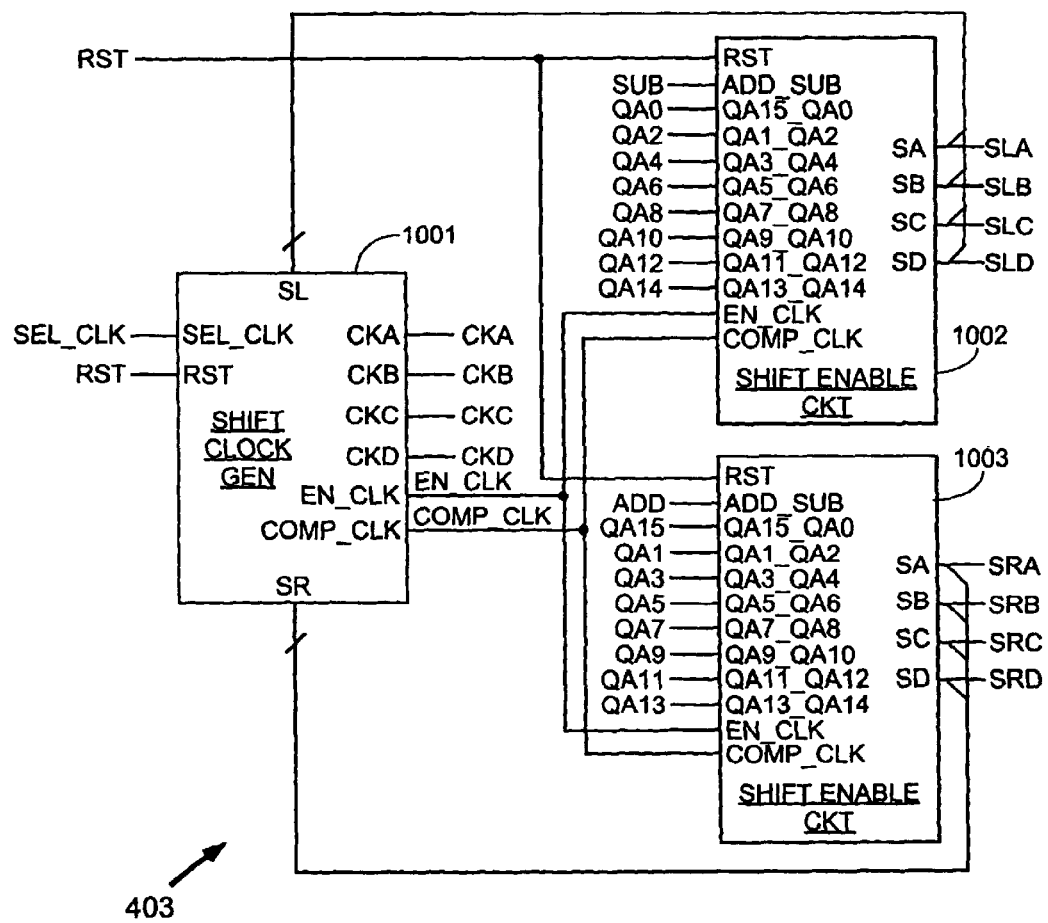
FIG. 10 is a block diagram of a multiplexer control circuit that can be used, for example, in the DLL of FIG. 4.

FIG. 10 is a block diagram of one embodiment of multiplexer control circuit 403 of FIG. 4. The pictured embodiment includes a shift clock generator 1001 and two shift enable circuits 1002 and 1003. In the pictured embodiment, shift clock generator 1001 is clocked by signal SEL_CLK, the output clock from the bi-directional shift register and multiplexer circuit 402. In other embodiments (not shown), shift clock generator 1001 is clocked by other clock signals, e.g., signal FBCLK or signal CKIN. The shift clock generator circuit provides the four clock signals CKA-CKD for the four shift registers in bi-directional shift register and multiplexer 402 (see FIGS. 4–6).

The two shift enable circuits 1002 and 1003 provide the shift enable signals SL and SR, respectively, for each of the four shift registers in bi-directional shift register and multiplexer 402 (see FIGS. 4–6). Shift enable circuit 1002 provides shift left enable signals SLA-SLD, and shift enable circuit 1003 provides shift right enable signals SRA-SRD.

Figure 11:
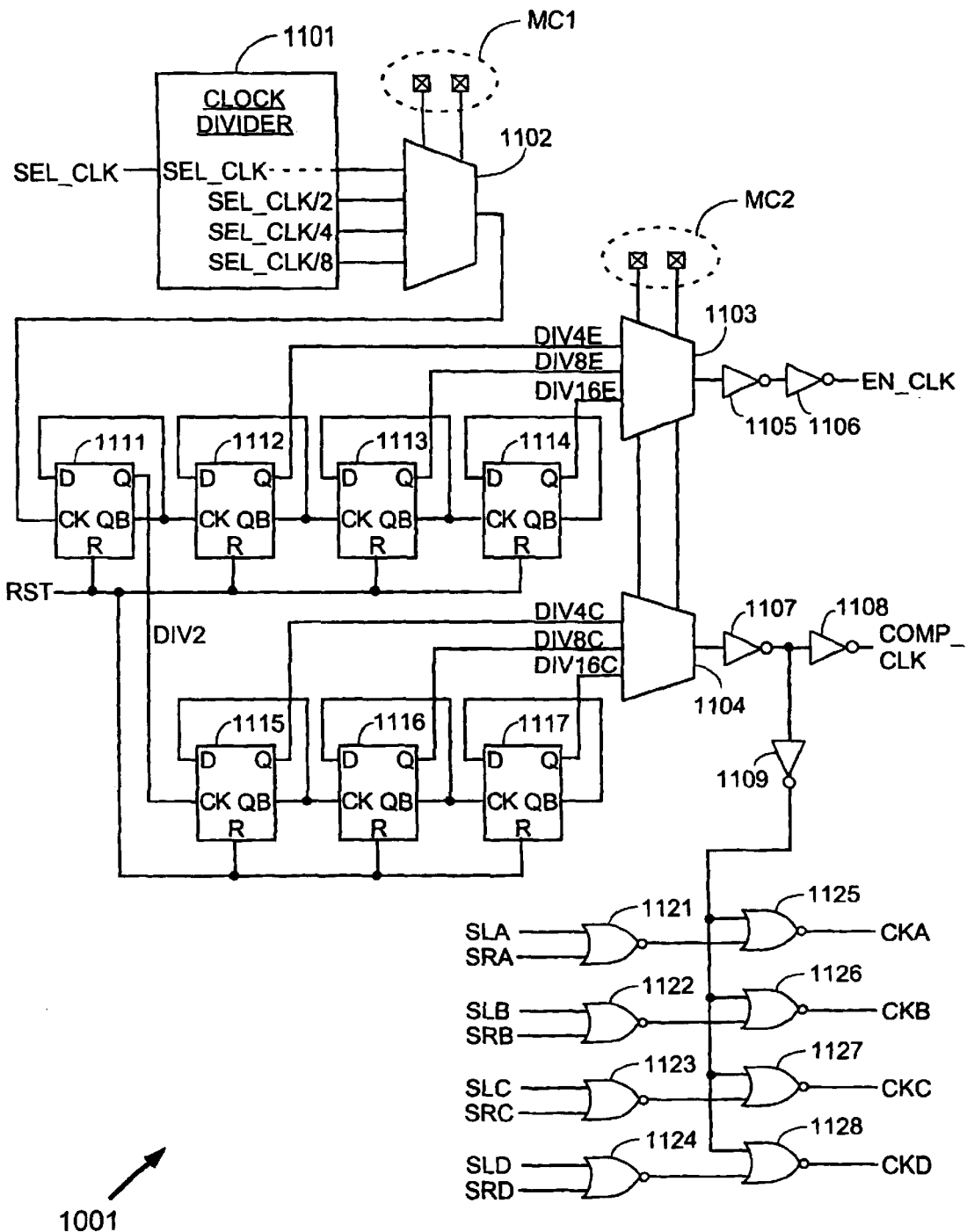
FIG. 11 is a schematic diagram of a shift clock generator circuit that can be used, for example, in the multiplexer control circuit of FIG. 10.

FIG. 11 is a schematic diagram for one embodiment of shift clock generator circuit 1001 of FIG. 10. The pictured embodiment includes clock divider 1101, 4-to-1 multiplexers 1102–1104, reset flip-flops 1111–1117, inverters 1105–1109, and 2-input NOR gates 1121–1128.

Clock signal SEL_CLK drives clock divider 1101, which provides a divided-by-two clock signal SEL_CLK/2, a divided-by-four clock signal SEL_CLK/4, and a divided-by-eight clock signal SEL_CLK/8. Any known clock divider circuit can be used to implement clock divider 1101. In some embodiments, the shift clock generator forms a portion of a programmable logic device (PLD), and the clock divider is controlled by programmable memory cells (not shown). In other embodiments, the clock divider is not programmable, or is omitted altogether. The presence of clock divider 1101 can be helpful because it permits user control of the frequency with which the DLL of FIG. 4 changes the delay on the output clock path. In the pictured embodiment, clock divider 1101 provides signal SEL_CLK and the three divided clock signals to multiplexer 1102, which is controlled by programmable memory cells MC1.

Shift clock generator circuit 1001 provides several different clock signals. In addition to providing the four clock signals CKA-CKD used by the four shift registers, circuit 1001 also provides two clock signals EN_CLK and COMP_CLK to shift enable circuits 1002–1003 (see FIG. 10). Signal EN_CLK is used to register and clock the shift enable signals (SA-SD, SLA-SLD, SRA-SRD). Signal COMP_CLK is used in generating the clocks CKA-CKD for the shift registers. The separation of the two clock signals allows for user control over the sample rate for the DLL.

In the pictured embodiment, flip-flops 1111–1114 are coupled in series. Flip-flop 1111 is clocked by the output signal from multiplexer 1102, and each succeeding flip-flop is clocked by the inverted output signal QB from the previous flip-flop in the series. Each flip-flop 1111–1114 has a data input terminal D coupled to receive the inverted output signal of the same flip-flop. Thus, these flip-flops are configured as toggle flip-flops, and together form a clock divider circuit. The output signals from flip-flops 1112, 1113, and 1114 provide signals DIV4E, DIV8E, and DIV16E, respectively. 3-to-1 multiplexer 1103 is controlled by memory cells MC2 to provide a selected clock signal to inverters 1105 and 1106 (coupled in series), and hence to output terminal EN_CLK.

Flip-flops 1115–1117 are coupled in series. Flip-flop 1115 is clocked by the output signal Q of flip-flop 1111, and each succeeding flip-flop is clocked by the inverted output signal QB from the previous flip-flop in the series. Each flip-flop 1115–1117 has a data input terminal D coupled to receive the inverted output signal of the same flip-flop. Thus, these flip-flops are configured as toggle flip-flops, and together form a clock divider circuit. The output signals from flip-flops 1115, 1116, and 1117 provide signals DIV4C, DIV8C, and DIV16C, respectively. 3-to-1 multiplexer 1104 is controlled by memory cells MC2 to provide a selected clock signal to inverter 1107 and hence to inverter 1108, which drives output terminal COMP_CLK. Inverter 1107 also drives inverter 1109. Therefore, inverter 1109 provides a signal having the same value and similar timing to clock signal COMP_CLK.

Signals SLA and SRA drive NOR gate 1121, which in turn drives NOR gate 1125 along with inverter 1109. NOR gate 1125 provides clock signal CKA to one of the shift registers (e.g., the top shift register in FIG. 6). Similarly, signals SLB and SRB drive NOR gate 1122, which in turn drives NOR gate 1126 along with inverter 1109. NOR gate 1126 provides clock signal CKB to the second shift register in FIG. 6. Signals SLC and SRC drive NOR gate 1123, which in turn drives NOR gate 1127 along with inverter 1109. NOR gate 1127 provides clock signal CKC to the third shift register in FIG. 6. Finally, signals SLD and SRD drive NOR gate 1124, which in turn drives NOR gate 1128 along with inverter 1109. NOR gate 1128 provides clock signal CKD to the fourth shift register in FIG. 6.

Figure 12:
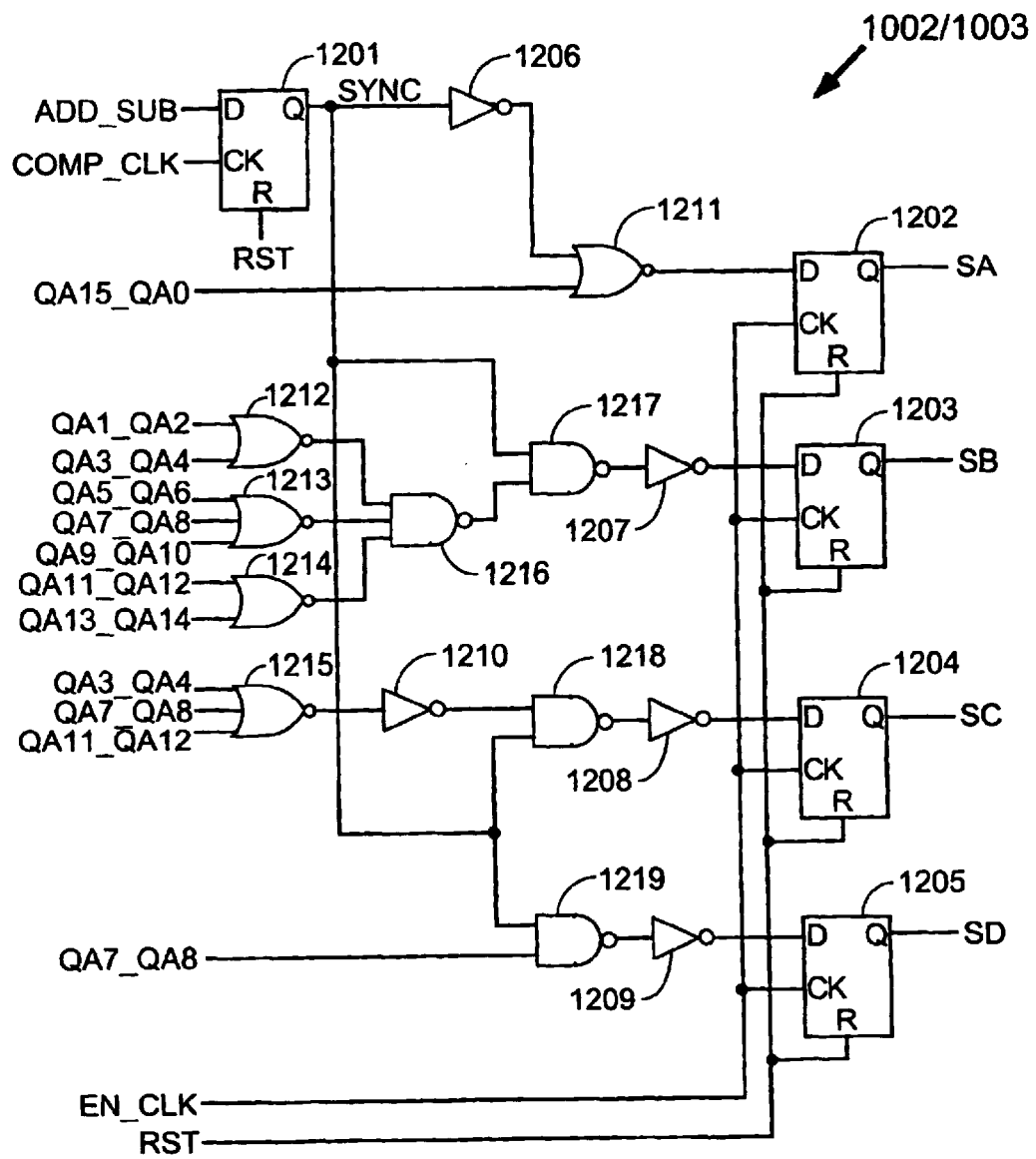
FIG. 12 is a schematic diagram of a shift enable circuit that can be used, for example, in the multiplexer control circuit of FIG. 10.

FIG. 12 is a schematic diagram for one embodiment of shift enable circuits 1002 and 1003 of FIG. 10. The pictured embodiment includes reset flip-flops 1201–1205, inverters 1206–1210, NOR gates 1211–1215, and NAND gates 1216–1219. Each shift enable circuit provides four shift enable signals SA-SD, which in circuit 1002 provide shift left enable signals SLA–SLD, and in circuit 1003 provide shift right enable signals SRA-SRD.

Flip-flop 1201 stores signal ADD_SUB (signal ADD for shift enable circuit 1003, signal SUB for circuit 1002), and is clocked by signal COMP_CLK. The stored ADD_SUB value is provided to the rest of the circuit as signal SYNC. The remainder of the circuit is essentially a state machine that provides the values of signals SA-SD based on the values stored in the various shift registers of FIG. 6. Note that the following naming convention is used for the signals from the shift registers: the name QAx_QAy signifies signal QAx for circuit 1003 and signal QAy for circuit 1002.

Flip-flops 1202–1205 are clocked by signal EN_CLK and reset by reset signal RST. Flip-flop 1202 stores a high value for signal SA when signal SYNC is high and signal QA15_QA0 is low. If signal QA15_QA0 is high, then the token bit is at either the left end or the right end of the shift register. In shift enable circuit 1002 of FIG. 10, for example, if signal QA15_QA0 is high then signal QA0 is high and the token bit is at the left end of the shift register. Signal ADD_SUB is supplied by signal SUB, meaning a shift to the left is selected. Therefore, under these circumstances the shift should not take place, and signal SLA (signal SA in FIG. 12) is driven low. Similarly, in shift enable circuit 1003 of FIG. 10, if signal QA15_QA0 is high then signal QA15 is high and the token bit is at the right end of the shift register. Signal ADD_SUB is supplied by signal ADD, meaning a shift to the right is selected. Therefore, under these circumstances the shift should not take place, and signal SRA (signal SA in FIG. 12) is driven low.

Flip-flop 1203 stores a high value for signal SB when signal SYNC is high, at least one of signals QA1_QA2 and QA3_QA4 is high, at least one of signals QA5_QA6, QA7_QA8, and QA9_QA10 is high, and at least one of signals QA11_QA12 and QA13_QA14 is high. Flip-flop 1204 stores a high value for signal SC when signal SYNC is high, and at least one of signals QA3_QA4, QA7_QA8, and QA11_QA12 is high. Flip-flop 1205 stores a high value for signal SD when signals SYNC and QA7_QA8 are both high.

Figure 13:
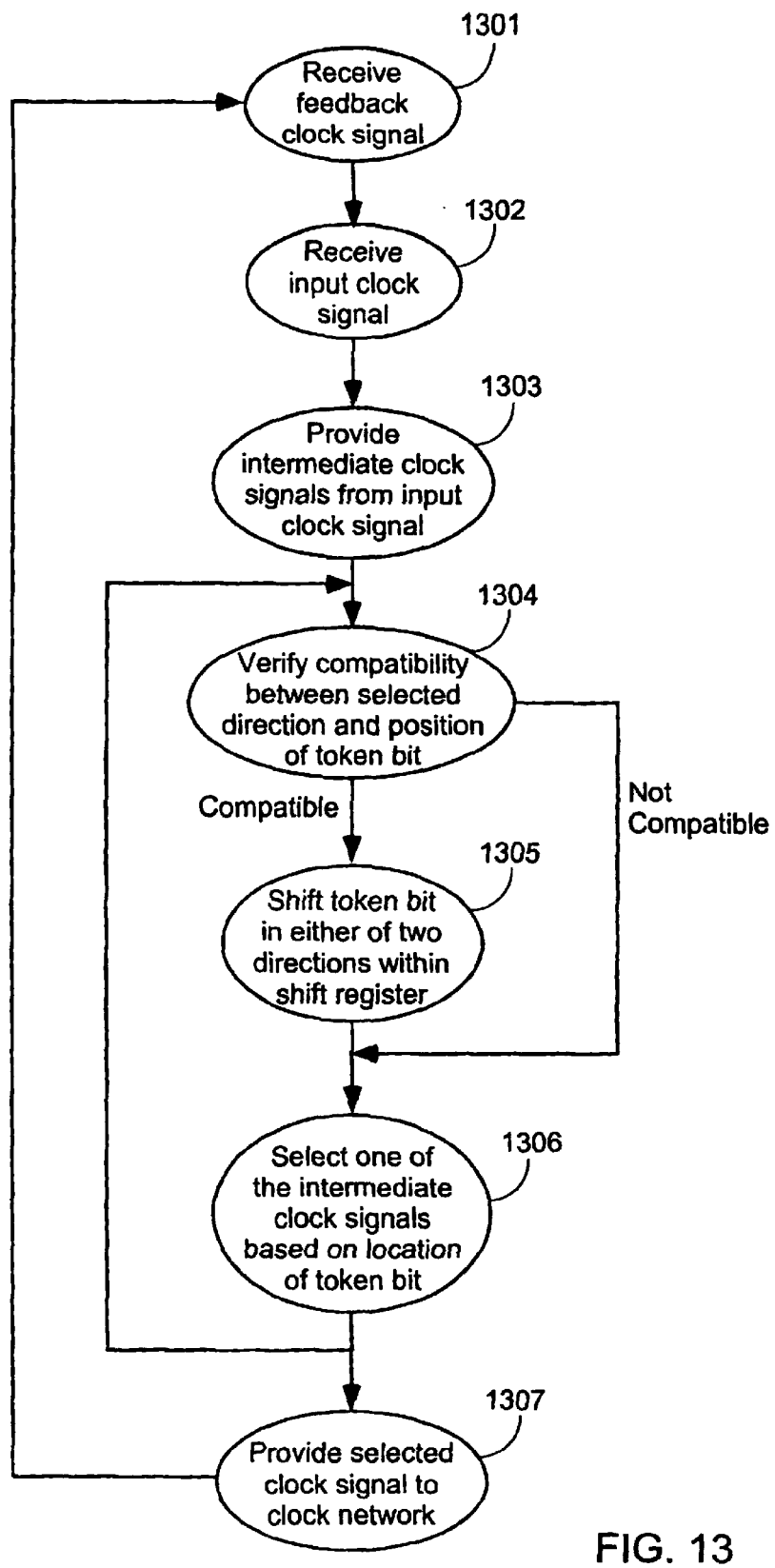
FIG. 13 illustrates the steps of an exemplary method of synchronizing a feedback clock signal from a clock network with an input clock signal, according to one embodiment of the present invention.

FIG. 13 shows the steps of an exemplary method of synchronizing a feedback clock signal from a clock network with an input clock signal, according to another embodiment of the invention. The steps illustrated in FIG. 13 can be performed, for example, using a system such as that shown in FIG. 4.

In step 1301, a clock feedback signal (e.g., feedback clock signal FBCLK in FIG. 4) is received. In step 1302, an input clock signal is received (e.g., input clock signal CKIN in FIG. 4). Clearly, steps 1301 and 1302 need not occur in the order shown. In step 1303, a plurality of intermediate clock signals delayed from the input clock signal by incremental unit delays are provided from the input clock signal. For example, referring again to FIG. 4, in one embodiment signals CLK0–CLKn are provided from input clock signal CKIN.

In some embodiments, the next step is to shift the location of a token bit within a shift register that selects one of the intermediate clock signals (step 1305). However, in some embodiments a compatibility test is first performed (step 1304). For example, the compatibility test can be performed by multiplexer control circuit 403 of FIG. 4. (For a detailed example, see the explanation of this feature in the text relating to FIG. 12). The compatibility test checks for compatibility between a selected direction for the upcoming shift and the position of the token bit within the shift register. For example, referring again to FIG. 4, if the ADD and SUB signals from phase detector 404 indicate a shift to the right, but the token bit is already in the rightmost location in the shift register, the shift (step 1305) does not take place. Similarly, if the ADD and SUB signals indicate a shift to the left, but the token bit is already in the leftmost location in the shift register, the shift (step 1305) does not take place.

If compatibility between the selected direction and the position of the token bit is verified, the token bit is shifted in either of two directions within a first shift register (step 1305). In one embodiment, a high token bit is shifted within one of the shift registers illustrated in FIG. 6. In step 1306, one of the intermediate clock signals is selected based on a location of the first token bit within the first shift register.

In some embodiments, steps 1304–1306 are repeated. For example, in the embodiment of FIG. 6, steps 1304–1306 are performed four times, each time reducing the number of available intermediate clock signals by a factor of two. For example, the second shift register includes exactly half as many memory elements as the first shift register.

In step 1307, the selected clock signal is provided to the clock network. In most applications, steps 1301–1307 will then be repeated continuously while the device controlled by the clock network is in operation.

Those having skill in the relevant arts of the invention will now perceive various modifications and additions that can be made as a result of the disclosure herein. For example, the above text describes the circuits of the invention in the context of programmable logic devices (PLDs). However, the circuits of the invention can also be implemented in other integrated circuits, including non-programmable circuits. The circuits of the invention can also be implemented in other electronic systems, for example, in printed circuit boards including discrete devices.

Further, flip-flops, multiplexers, delay lines, delay elements, clock trees, clock networks, phase detectors, multiplexer control circuits, shift registers, bi-directional shift registers, shift clock generators, shift enable circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A delay lock loop (DLL) circuit coupled between output and input terminals of a clock network, the DLL circuit comprising:
   an input clock terminal;
   a feedback clock terminal coupled to the output terminal of the clock network;
   a delay line having an input terminal coupled to the input clock terminal and having a plurality of output terminals providing a plurality of intermediate clock signals;
   a control circuit having a first input terminal coupled to the feedback clock terminal, a second input terminal coupled to the input clock terminal, and a plurality of control output terminals; and
   a bi-directional shift register and clock multiplexer having a plurality of data input terminals coupled to the output terminals of the delay line, a plurality of control input terminals coupled to the control output terminals of the control circuit, and an output terminal coupled to the input terminal of the clock network, wherein:

the bi-directional shift register comprises a token bit shifted under control of the control circuit;

the clock multiplexer selects one of the intermediate clock signals, as determined by a location of the token bit within the bi-directional shift register, to supply to the output terminal;

the control circuit comprises a shift clock generator circuit and a shift enable circuit;

the shift clock generator circuit provides a plurality of control signals to a first subset of the control input terminals of the bi-directional shift register and clock multiplexer; and the shift enable circuit provides a plurality of shift enable signals to a second subset of the control input terminals of the bi-directional shift register and clock multiplexer.

2. The DLL circuit of claim 1, wherein:

the output terminal of the bi-directional shift register and clock multiplexer is coupled to a third input terminal of the control circuit; and the shift clock generator circuit comprises a clock divider circuit having an input terminal coupled to the third input terminal of the control circuit.

3. The DLL circuit of claim 2, wherein the clock divider circuit is programmable.

4. A delay lock loop (DLL) circuit coupled between output and input terminals of a clock network, the DLL circuit comprising:

an input clock terminal;

a feedback clock terminal coupled to the output terminal of the clock network;

a delay line having an input terminal coupled to the input clock terminal and having a plurality of output terminals providing a plurality of intermediate clock signals;

a control circuit having a first input terminal coupled to the feedback clock terminal, a second input terminal coupled to the input clock terminal, and a plurality of control output terminals; and a bi-directional shift register and clock multiplexer having a plurality of data input terminals coupled to the output terminals of the delay line, a plurality of control input terminals coupled to the control output terminals of the control circuit, and an output terminal coupled to the input terminal of the clock network, wherein the bi-directional shift register comprises a token bit shifted under control of the control circuit, wherein the clock multiplexer selects one of the intermediate clock signals, as determined by a location of the token bit within the bi-directional shift register, to supply to the output terminal, and wherein the bi-directional shift register and clock multiplexer comprises a plurality of shift register circuits coupled together through a plurality of multiplexer circuits, each of the shift register circuits being bi-directional and storing an associated token bit, each succeeding one of the shift register circuits comprising a smaller number of memory elements and each succeeding one of the multiplexer circuits comprising a smaller number of multiplexers until a single one of the shifted intermediate clocks signals has been selected.

5. The DLL circuit of claim 4, wherein each succeeding one of the shift register circuits comprises exactly as many memory elements as a preceding shift register circuit, and each succeeding one of the multiplexer circuits comprises exactly half as many multiplexers as a preceding multiplexer circuit.

6. A system, comprising:

a clock network having an input terminal and an output terminal; and a delay lock loop (DLL) circuit coupled between the output and input terminals of the clock network, the DLL circuit comprising:

an input clock terminal;

a feedback clock terminal coupled to the output terminal of the clock network;

a delay line having an input terminal coupled to the input clock terminal and having a plurality of output terminals providing a plurality of intermediate clock signals;

a control circuit having a first input terminal coupled to the feedback clock terminal, a second input terminal coupled to the input clock terminal, and a plurality of control output terminals; and a bi-directional shift register and clock multiplexer having a plurality of data input terminals coupled to the output terminals of the delay line, a plurality of control input terminals coupled to the control output terminals of the control circuit, and an output terminal coupled to the input terminal of the clock network, wherein:

the bi-directional shift register comprises a token bit shifted under control of the control circuit;

the clock multiplexer selects one of the intermediate clock signals, as determined by a location of the token bit within the bi-directional shift register, to supply to the output terminal;

the control circuit comprises a shift clock generator circuit and a shift enable circuit;

the shift clock generator circuit provides a plurality of control signals to a first subset of the control input terminals of the bi-directional shift register and clock multiplexer; and the shift enable circuit provides a plurality of shift enable signals to a second subset of the control input terminals of the bi-directional shift register and clock multiplexer.

7. The system of claim 6, wherein:

the output terminal of the bi-directional shift register and clock multiplexer is coupled to a third input terminal of the control circuit; and the shift clock generator circuit comprises a clock divider circuit having an input terminal coupled to the third input terminal of the control circuit.

8. The system of claim 7, wherein the clock divider circuit is programmable.

9. A system, comprising:

a clock network having an input terminal and an output terminal; and a delay lock loop (DLL) circuit coupled between the output and input terminals of the clock network, the DLL circuit comprising:

an input clock terminal;

a feedback clock terminal coupled to the output terminal of the clock network;

a delay line having an input terminal coupled to the input clock terminal and having a plurality of output terminals providing a plurality of intermediate clock signals;

a control circuit having a first input terminal coupled to the feedback clock terminal, a second input terminal coupled to the input clock terminal, and a plurality of control output terminals; and a bi-directional shift register and clock multiplexer having a plurality of data input terminals coupled to the output terminals of the delay line, a plurality of control input terminals coupled to the control output terminals of the control circuit, and an output terminal coupled to the input terminal of the clock network, wherein the bi-directional shift register comprises a token bit shifted under control of the control circuit, wherein the clock multiplexer selects one of the intermediate clock signals, as determined by a location of the token bit within the bi-directional shift register, to supply to the output terminal, and wherein the bi-directional shift register and clock multiplexer comprises a plurality of shift register circuits coupled together through a plurality of multiplexer circuits, each of the shift register circuits being bi-directional and storing an associated token bit, each succeeding one of the shift register circuits comprising a smaller number of memory elements and each succeeding one of the multiplexer circuits comprising a smaller number of multiplexers until a single one of the shifted intermediate clocks signals has been selected.

10. The system of claim 9, wherein each succeeding one of the shift register circuits comprises exactly half as many memory elements as a preceding shift register circuit, and each succeeding one of the multiplexer circuits comprises exactly half as many multiplexers as a preceding multiplexer circuit.

11. A method of synchronizing a feedback clock signal from a clock network with an input clock signal, the method comprising:

receiving the feedback clock signal;

receiving the input clock signal;

providing from the input clock signal a plurality of intermediate clock signals delayed from the input clock signal by incremental unit delays;

shifting a first token bit in either of two directions within a first shift register;

selecting from among the intermediate clock signals a selected clock signal based on a location of the first token bit within the first shift register;

providing the selected clock signal to the clock network; and shifting a second token bit in either of the two directions within a second shift register, wherein selecting from among the intermediate clock signals the selected clock signal based on the location of the first token bit within the first shift register further comprises selecting from among the intermediate clock signals the selected clock signal based on a location of the second token bit within the second shift register.

12. The method of claim 11, wherein the second shift register comprises exactly half as many memory elements as the first shift register.

13. A method of synchronizing a feedback clock signal from a clock network with an input clock signal, the method comprising:

receiving the feedback clock signal;

receiving the input clock signal;

providing from the input clock signal a plurality of intermediate clock signals delayed from the input clock signal by incremental unit delays;

shifting a first token bit in either of two directions within a first shift register;

selecting from among the intermediate clock signals a selected clock signal based on a location of the first token bit within the first shift register;

providing the selected clock signal to the clock network; and verifying, prior to shifting the first token bit in either of two directions, that a selected one of the two directions is compatible with a position of the first token bit within the first shift register.

14. A system for synchronizing a feedback clock signal from a clock network with an input clock signal, the system comprising:

means for receiving the feedback clock signal;

means for receiving the input clock signal;

means for providing from the input clock signal a plurality of intermediate clock signals delayed from the input clock signal by incremental unit delays;

means for shifting a first token bit in either of two directions within a first shift register;

means for selecting from among the intermediate clock signals a selected clock signal based on a location of the first token bit within the first shift register;

means for providing the selected clock signal to the clock network; and means for verifying that a selected one of the two directions is compatible with a position of the first token bit within the first shift register.

15. A multiplexer circuit, comprising:

N data input terminals, wherein N is an integer;

an output terminal;

a first bi-directional shift register comprising N bits and N output terminals, wherein exactly one of the N bits has a first token value;

an N-to-M multiplexer comprising N data input terminals coupled to the N data input terminals of the multiplexer circuit, N control terminals coupled to the N output terminals of the first bi-directional shift register, and M output terminals, wherein M is an integer less than N;

a second bi-directional shift register comprising M bits and M output terminals, wherein exactly one of the M bits has a second token value; and an M-to-1 multiplexer comprising M data input terminals coupled to the M data output terminals of the N-to-M multiplexer, M control terminals coupled to the M output terminals of the second bi-directional shift register, and an output terminal coupled to the output terminal of the multiplexer circuit.

16. The multiplexer circuit of claim 15, wherein N is two times M.

17. The multiplexer circuit of claim 15, wherein the first and second token values are high values.

18. The multiplexer circuit of claim 15, wherein the first and second token values are the same value.

* * * * *